United States Patent
Kang

[19]

[11] Patent Number: 6,097,659
[45] Date of Patent: Aug. 1, 2000

[54] POWER-UP CIRCUIT FOR SEMICONDUCTOR MEMORY DEVICE

[75] Inventor: Dong-Keum Kang, Cheongju, Rep. of Korea

[73] Assignee: LG Semicon Co., Ltd., Choongcheongbuk-do

[21] Appl. No.: 09/239,858

[22] Filed: Jan. 29, 1999

[30] Foreign Application Priority Data

Oct. 31, 1998 [KR] Rep. of Korea ................ 98-46609

[51] Int. Cl.[7] ............................................. G11C 7/00
[52] U.S. Cl. ........................ 365/226; 365/194; 327/540
[58] Field of Search ................................ 365/226, 194; 327/538, 540, 530, 189.01

[56] References Cited

U.S. PATENT DOCUMENTS

| | | | |
|---|---|---|---|
| 5,319,601 | 6/1994 | Kawata et al. | 365/226 |
| 5,349,559 | 9/1994 | Park et al. | 365/201 |
| 5,352,935 | 10/1994 | Yamamura et al. | 327/540 |
| 5,408,435 | 4/1995 | McClure et al. | 365/201 |
| 5,557,579 | 9/1996 | Raad et al. | 365/226 |
| 5,768,207 | 6/1998 | Raad et al. | 365/226 |

*Primary Examiner*—David Nelms
*Assistant Examiner*—Hoai V. Ho

[57] ABSTRACT

A power-up circuit for a semiconductor memory device includes an external supply voltage level detector for detecting an external supply voltage level received from an exterior, and generating an external supply voltage detection signal when a predetermined voltage level is detected, an internal supply voltage level detector for detecting an internal supply voltage level and generating an internal supply voltage detection signal when a predetermined voltage level is detected, and a power-up signal generator for receiving the internal and external supply voltage detection signals and generating a low level power-up signal at a falling edge of the internal supply voltage detection signal. The circuit prevents an access of the external device, thereby preventing the generation of an excessive current such as a latch-up caused by an instability at the internal nodes and the unstable operation of the internal circuit.

17 Claims, 5 Drawing Sheets

POWER-UP CIRCUIT FOR SEMICONDUCTOR MEMORY DEVICE

BACKGROUND OF THE INVENTION

1. Field of the Invention

The present invention relates to a power-up circuit, and more particularly, to an improved power-up circuit which generates a power-up signal using an external supply voltage detection signal and an internal supply voltage detection signal.

2. Description of the Background Art

In recent years, a supply voltage for a memory device has been gradually lowered due to large integration and a minimized semiconductor memory device circuitry. Consequently, an external supply voltage lowered to a predetermined level is employed as an internal supply voltage to operate internal circuits for the memory device.

In order to normally carry out such a semiconductor memory device, the external supply voltage level should be maintained at higher than a predetermined level. Therefore, an initially supplied voltage level is detected during an initial supply voltage input and the power-up signal is then generated to detect that the supply voltage has obtained its predetermined level, thereby controlling significant internal control signals such as /RAS, /CAS.

For that purpose, the conventional semiconductor device detects the level of an external supply voltage externally applied, and when the external supply voltage reaches a predetermined level, the power-up signal is generated. Or the level of the internal supply voltage applied to the internal circuit is detected, and when the internal supply voltage reaches a predetermined level, the power-up signal is generated.

FIGS. 1A and 1B are wave form views illustrating the signal generation in a power-up signal circuit of the conventional semiconductor memory. That is, FIG. 1A is a schematic wave view of the power-up signal generated by detecting the external supply voltage level, and FIG. 1B is a schematic wave view of the power-up signal generated by detecting the internal supply voltage level.

With reference to the drawings, the power-up signal generation process of the conventional semiconductor memory device will now be described.

First, as shown in FIG. 1A, the conventional power-up circuit detects an externally applied supply voltage level Vdd, and generates a "low" level power-up signal PUPB1 at a time point ta when the voltage level becomes a predetermined level Va, and accordingly from that time point, the internal circuit becomes normal in operation.

When the external voltage Vdd is supplied, it is lowered down to a predetermined level so that it takes a predetermined time to generate an internal voltage Vint required for the internal circuit. Therefore, the time interval (Ta~Tint) ranging from the time point ta when the power-up signal PUPB1 is generated, to a time point when the internal voltage Vint is generated remains at a state in which a normal level supply voltage is not applied to the internal circuit, so that at this time an unstable operation may occur during an access from the external device. Further, an excessive current such as latch-up may occur due to the instability in internal nodes.

FIG. 1B is a view illustrating a power-up circuit of the conventional semiconductor memory device to solve the above problem. As shown therein, the internal supply voltage level Vint is detected and the "high" level power-up signal PUPB2 is generated for a predetermined time period at a time point tb when the voltage becomes a predetermined level Vb and accordingly the respective states of the memory devices are reset as an initializing process. Then, there begins a normal operation of the internal circuit.

However, in such a power-up circuit, although it is possible to reset the input at an unstable state in which a normal level internal supply voltage Vint is generated by the power-up signal PUPB2, since the power-up signal PUPB2 maintains a "low" level at intervals 0~tb which are prior to the generation of the power-up signal PUPB2, the subsequent unstable state still exists, thereby disadvantageously generating an excessive current such as a latch-up.

SUMMARY OF THE INVENTION

The present invention is directed to overcoming the conventional disadvantages. Therefore, it is an object of the present invention to provide a power-up circuit which prevents an external access at intervals before the internal supply voltage level becomes normal by using the external supply voltage detection signal and the internal supply voltage detection signal.

To achieve the above-described object, there is provided a power-up circuit according to the present invention which includes an external supply voltage level detector for detecting an external supply voltage level received from an exterior, and generating an external supply voltage detection signal when a predetermined voltage level is detected, an internal supply voltage level detector for detecting an internal supply voltage level and generating an internal supply voltage detection signal when a predetermined voltage level is detected, and a power-up signal generator for receiving the internal and external supply voltage detection signals and generating a low level power-up signal at a falling edge of the internal supply voltage detection signal.

The object and advantages of the present invention will become more readily apparent from the detailed description given hereinafter. However, it should be understood that the detailed description and specific example, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become better understood with reference to the accompanying drawings which are given only by way of illustration and thus are not limitative of the present invention, wherein.

DETAILED DESCRIPTION OF THE PREFERRED EMBODIMENTS

With reference to the accompanying drawings, the power-up circuit according to the present invention of the present invention will now be described.

Figure 1A:
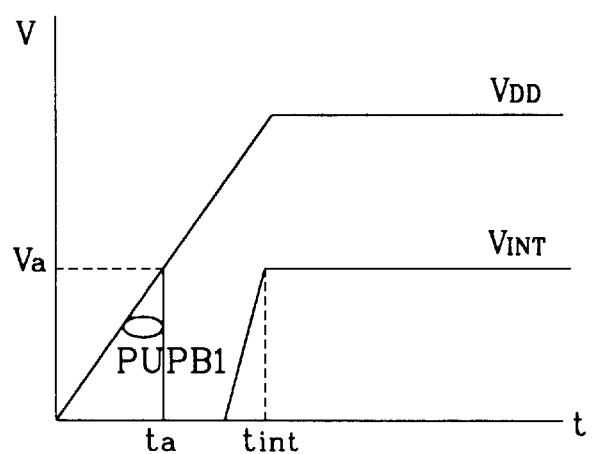
FIG. 1A is a waveform view of a power-up signal generated by detecting an external supply voltage level in a semiconductor memory device according to the conventional art.
Figure 1B:
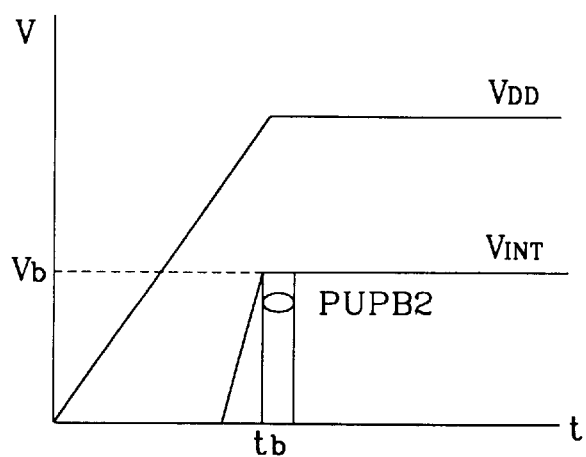
FIG. 1B is a wave form view of a power-up signal generated by detecting an internal supply voltage level in a semiconductor memory device according to the conventional art.
Figure 2:
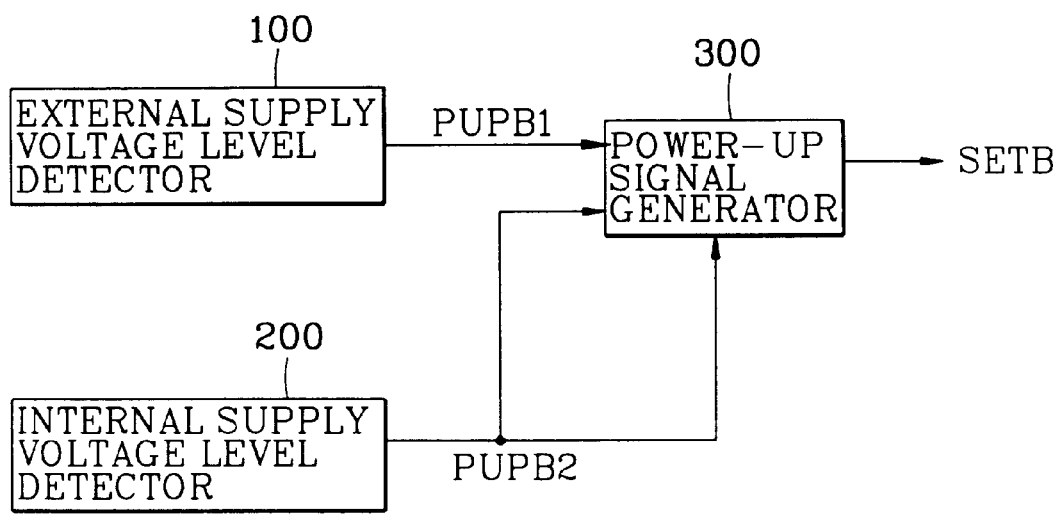
FIG. 2 is a block diagram illustrating a power-up circuit according to the present invention.

FIG. 2 is a block diagram illustrating a power-up circuit according to the present invention. As shown therein, the power-up circuit includes: an external supply voltage level detector for detecting an external supply voltage level Vdd received from an exterior, and generating an external supply voltage detection signal PUPB1 when a predetermined voltage level is detected; an internal supply voltage level detector 200 for detecting an internal supply voltage level Vint and generating an internal supply voltage detection signal PUPB2 when a predetermined voltage level is detected; and a power-up signal generator 300 for receiving the internal and external supply voltage detection signals PUPB1, PUPB2, and generating a "low" level power-up signal SETB at a falling edge of the internal supply voltage detection signal PUPB2.

Figure 3:
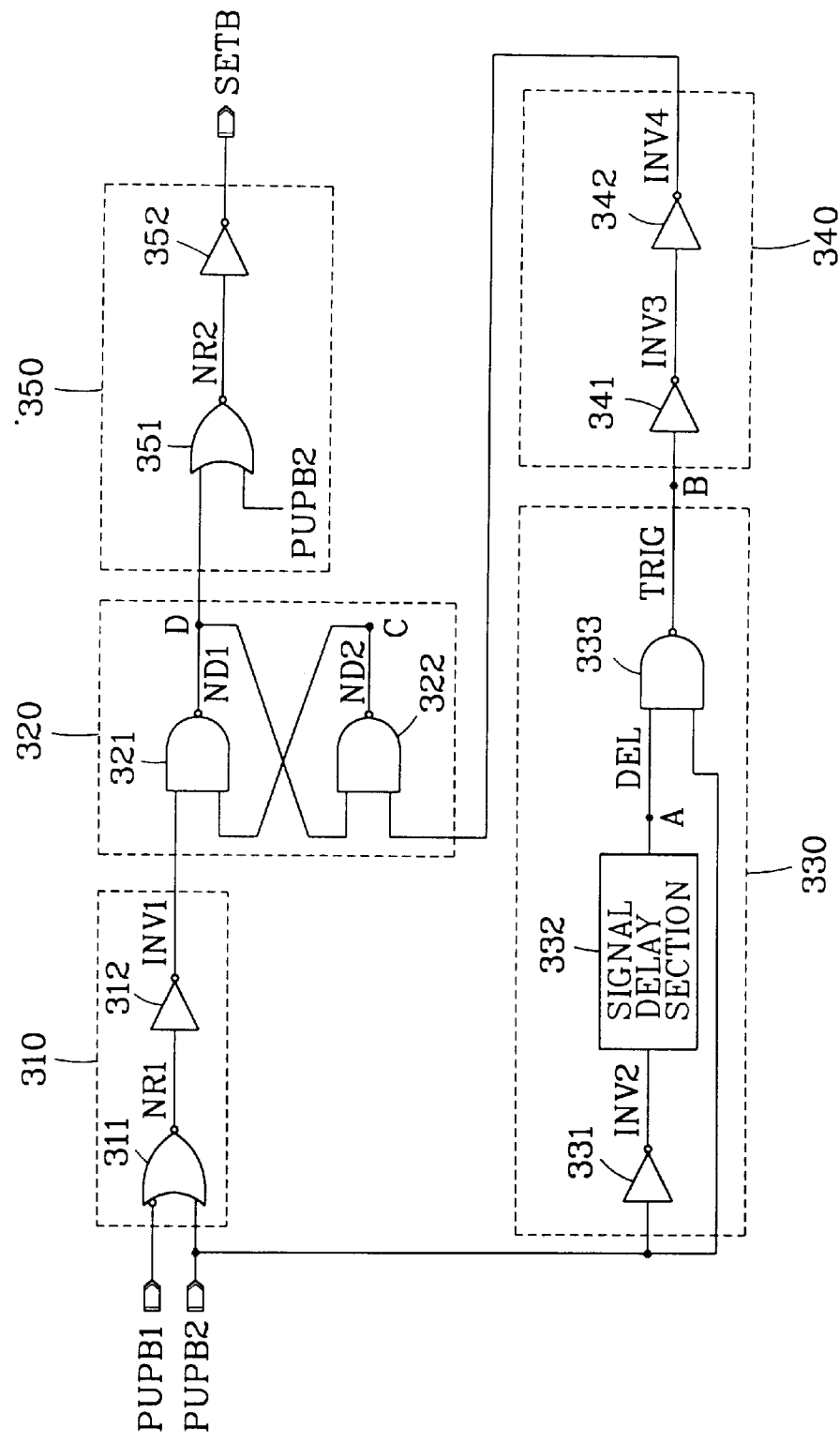
FIG. 3 is a circuit view detailing a power-up signal generator in FIG. 2.

Also, FIG. 3 illustrates a circuit view detailing the power-up signal generator 300. As shown therein, the power-up signal generator 300 includes: a signal input section 310 for receiving the external supply voltage detection signal PUPB1 and the internal supply voltage detection signal PUPB2 and outputting a signal INV1 having a phase contrary to the external supply voltage detection signal PUPB1; a latch section 320 for latching the signal INV1 received from the signal input section 310 for a predetermined time period; a trigger section 330 for generating a trigger signal TRIG for the latch section 320 using the internal supply voltage detection signal PUPB2 and the delay signal of the internal supply voltage detection signal PUPB2; a buffer section 340 for buffering the output signal TRIG of the trigger section 330 and outputting the buffered value to the latch section 320; and a signal output section 350 for receiving an output signal ND1 of the latch section 320 and the internal supply voltage detection signal PUPB2 and outputting a "low" level power-up signal SETB at a falling edge of the internal supply voltage detection signal PUPB2.

The signal input section 310 includes a NOR gate 311 for NORing an inversion signal PUPB1inv of the external supply voltage detection signal PUPB1 and the internal supply voltage detection signal PUPB2, and an inverter 312 for inverting an output signal NR1 of the NOR gate 311.

The latch section 320 includes a first NAND gate 321 for NANDing an output signal INV1 of the signal input section 310 and an output signal ND2 of the second NAND gate 322, and a second NAND gate 322 for NANDing an output signal INV4 of the buffer section 340 and an output signal ND1 of the first NAND gate 321.

The trigger section 330 includes an inverter for inverting the internal supply voltage detection signal PUPB2, a signal delay section 332 for delaying the output signal INV2 of the inverter 331 for a predetermined time period, and a NAND gate 333 for NANDing the output DEL of the signal delay section 332 and the internal supply voltage detection signal PUPB2.

The buffer section 340 includes a first and second inverters 341, 342 for sequentially inverting the output signal TRIG for the trigger section 330.

The signal output section 350 includes a NOR gate 351 for NORing the output signal ND1 of the latch section 320 and the internal supply voltage detection signal PUPB2, and an inverter 352 for inverting the output signal NR2 of the NOR gate 351.

Figure 4:
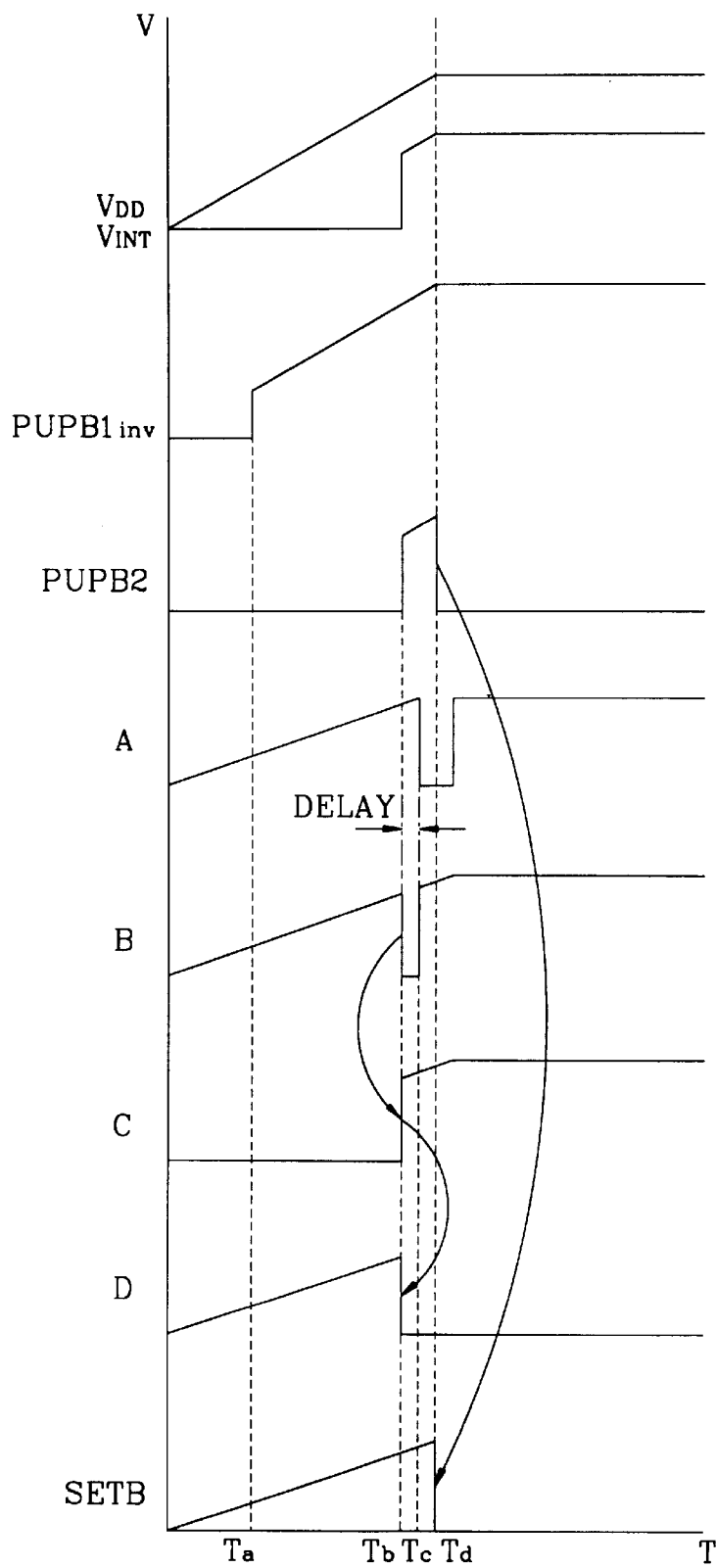
FIGS. 4 and 5 are timing views illustrating the operation of signals generated from respective nodes of the power-up signal generator in FIG. 2.
Figure 5:
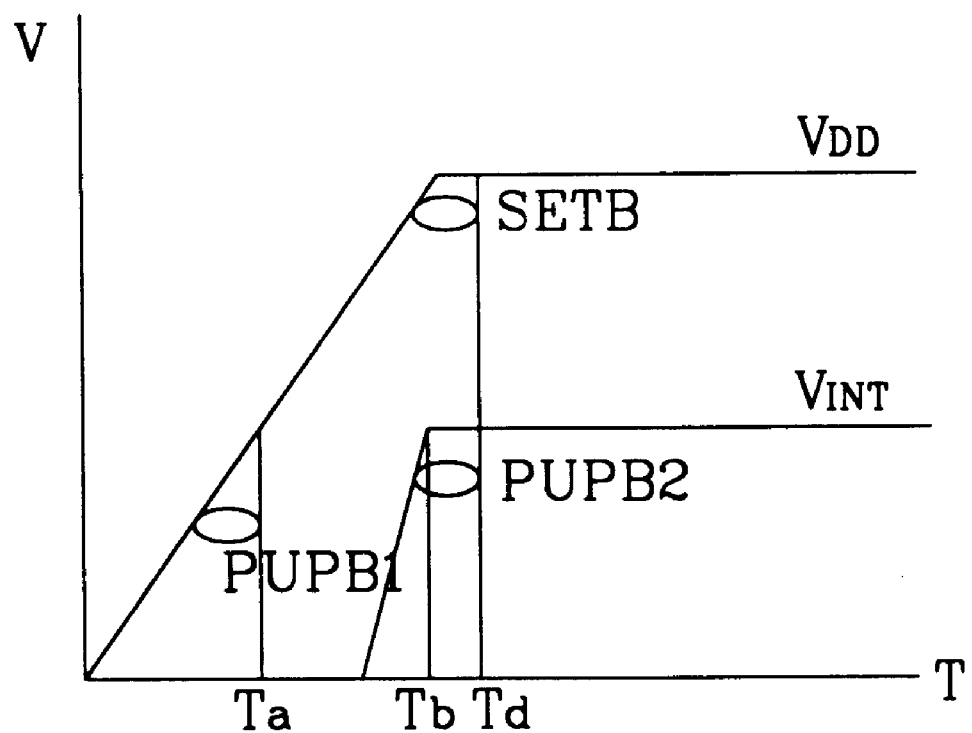

FIG. 4 is a view illustrating respective signals generated from the nodes in FIG. 3, and FIG. 5 is a wave form view illustrating a power-up signal according to the preferred embodiment of the present invention.

The operation of the power-up circuit according to the present invention will now be described in further detail.

First, the external supply voltage level detector 100 detects the externally applied supply voltage level Vdd and generates a "low" level external supply voltage detection signal PUPB1 at a time point Ta when the voltage reaches a predetermined level.

Meanwhile, the internal supply voltage level detector 200 detects the internal supply voltage Vint generated by the lowering of the external supply voltage Vdd and generates for a predetermined time period Tb~Td a "high" level internal supply voltage detection signal PUPB2 at a time point Tb when the voltage reaches a predetermined level.

That is, the external supply voltage detection signal PUPB1 and the internal supply voltage detection signal PUPB2 are respectively applied to the power-up signal generator 300 and accordingly the power-up signal SETB is generated. The operation process of the power-up signal generator 300 will now be explained according to transition points of the respective signals.

First, the operation at a time point Ta when the external supply voltage detection signal PUPB1 becomes activated from a "high" level to a "low" level.

The signal PUPB1inv inverted from the external supply voltage detection signal PUPB1 and the internal supply voltage detection signal PUPB2 are applied to the NOR gate 311. Here, the inversion signal PUPB1inv at the time point Ta when the external supply voltage detection signal PUPB1inv becomes transited to a "low" level and at this time the internal supply voltage detection signal PUPB2 maintains a "low" level, so that the NOR gate 311 outputs a "low" level signal NR1. The output signal NR1 of the NOR gate 311 becomes inverted by the inverter 312, so that the "high" level signal INV1 becomes applied to the first NAND gate 321 of the latch section 320.

Also, the internal supply voltage detection signal PUPB2 of the "low" level becomes inverted to a "high" level by the inverter 331 of the trigger section 330, delayed for a predetermined time period by the delay section 332, and then applied to the NAND gate 333.

Then, the NAND gate 333 NANDs a "high" level output signal DEL outputted from the signal delay section 332 and a "low" level internal supply voltage detection signal PUPB2, and outputs a "high" level signal TRIG. The signal TRIG passes through the first and second inverters 341, 342 of the buffer section 340 and it is applied to the second NAND gate 322 of the latch section 320.

Meanwhile, during a time interval 0~Ta when the external supply voltage detection signal PUPB1 becomes active in the latch section 320, a "low" level signal INV1 is applied to the first NAND gate 321, and a "high" level signal INV4 is applied to the second NAND gate 322, so that a node D at the output of the first NAND gate 321 becomes a "high" level.

Also, during a time point Ta when the external supply voltage detection signal PUPB1 become a "low" level, the input signal INV1 of the first NAND gate 321 becomes transited to a "high" level. At this time, a "high" level signal is still applied to the second NAND gate 322, whereby the node D maintains a "high" level.

When the "high" level signal ND1 from the latch section 320 is applied to the NOR gate 351 of the signal output section 350, the NOR gate 351 NORs a "low" level internal supply voltage detection signal PUPB2 to an input terminal thereof and an output signal of the latch section 320 to another input terminal thereof, thereby outputting a "low" level signal NR2. The signal NR2 becomes inverted by the inverter 352 and finally a "high" level signal is outputted, whereby an access from an external device is prevented during the interval.

The operation at the time point Tb when the internal supply voltage detection signal PUPB2 is transited to a "high" level will now be described.

When the internal supply voltage detection signal PUPB2 becomes transited from a "high" level to a "low" level, the output signal INV1 of the signal input section 310 is still maintained at a "high" level, and the inverter 331 of the trigger section 330 inverts the "high" level internal supply voltage detection signal PUPB2 and outputs a "low" level signal INV2. The delay section 332 delays the signal INV2 for a predetermined time period and outputs the delay signal DEL which is transited to a "low" level after a predetermined time delay as shown in A of FIG. 4.

Then, the NAND gate 333 NANDs the delay signal DEL and the internal supply voltage detection signal PUPB2, and generates a "low" level trigger signal TRIG from a time point Tb when the internal supply voltage detection signal PUPB2 is transited to a "high" level to another time point Tc when the delay signal DEL becomes transited to a "low" level.

When the thusly generated "low" level trigger signal TRIG is applied to the second NAND gate 322 of the latch section 322 via the buffer section 340, the signal level at the node C of the second NAND gate 322 becomes transited to a "high" level. Accordingly, the output node D of the first NAND gate becomes transited to a "low" level.

Also, when the "low" level output signal ND1 of the latch section 320 is applied to the NOR gate 351 of the signal output section 350, the NOR gate 351 NORs the "low" level signal ND1 outputted from the latch section 320 and the "high" level internal supply voltage detection signal PUPB2 and then outputs a "low" level signal NR2, whereby the final output signal that has passed through the inverter 352 still maintains a "high" level.

During a time point Tc when the internal supply voltage detection signal PUPB2 becomes transited from a "high" level to a "low" level, the output signal NR2 of the NOR gate 351 int he signal output section 350 becomes transited to a "high" level, so that signal NR2 becomes inverted by the inverter 352, whereby a "low" level power-up signal SETB becomes generated.

In other words, the power-up signal SETB becomes activated at a "low" level at a falling edge Tc of the internal supply voltage detection signal PUPB2 and accordingly a normal operation in the internal circuit is carried out.

As described above, in the power-up circuit according to the present invention, an access from the external device is prevented, thereby preventing the generation of an excessive current such as a latch-up caused by an instability at the internal nodes and the unstable operation of the internal circuit.

As the present invention may be embodied in several forms without departing from the spirit of essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within meets and bounds of the claims, or equivalences of such meets and bounds are therefore intended to embrace the appended claims.

What is claimed is:

1. A power-up circuit for a semiconductor memory device, comprising:

an external supply voltage level detector for detecting an external supply voltage that is external to said memory device and for generating an external supply voltage detection signal that indicates when said external supply voltage has risen to a first predetermined voltage level;

an internal supply voltage level detector for detecting an internal supply voltage that is internal to said memory device and for generating an internal supply voltage detection signal that indicates when said internal supply voltage has risen to a second predetermined voltage level; and a power-up signal generator for receiving the internal and external supply voltage detection signals and for generating a power-up signal to indicate when both said first and second predetermined voltage levels have been respectively achieved.

2. The circuit of claim 1, wherein the power-up signal generator comprises:

a signal input section for receiving the external supply voltage detection signal and the internal supply voltage detection signal and outputting a signal having a phase contrary to the external supply voltage detection signal;

a latch section for latching the signal received from the signal input section for a predetermined time period;

a trigger section for generating a trigger signal for the latch section using the internal supply voltage detection signal and the delay signal of the internal supply voltage detection signal; and a signal output section for receiving an output signal of the latch section and the internal supply voltage detection signal and outputting a low level power-up signal at a falling edge of the internal supply voltage detection signal.

3. The circuit of claim 2, wherein the signal input section comprises:

a NOR gate for NORing a signal inverted from the external supply voltage detection signal and the internal supply voltage detection signal; and an inverter for inverting an output signal of the NOR gate.

4. The circuit of claim 2, wherein the latch section comprises:

a first NAND gate for NANDing an output signal of the signal input section and an output signal of the second NAND gate; and a second NAND gate for NANDing a trigger signal of the trigger section and an output signal of the first NAND gate.

5. The circuit of claim 2, wherein the trigger section comprises:

an inverter for inverting the internal supply voltage detection signal;

a signal delay section for delaying the output signal of the inverter for a predetermined time period; and a NAND gate for NANDing an output signal of the signal delay section and the internal supply voltage detection signal.

6. The circuit of claim 2, wherein the signal output section comprises:
   a NOR gate for NORing an output signal of the latch section and the internal supply voltage detection signal; and
   an inverter for inverting the output signal of the NOR gate.

7. The circuit of claim 1, wherein said power-up signal is generated at a falling edge of said internal supply voltage detection signal.

8. The circuit of claim 2, wherein said power-up signal is generated at a falling edge of said internal supply voltage detection signal.

9. The circuit of claim 1, wherein the power-up signal generator comprises:
   a signal input section for receiving the external supply voltage detection signal and the internal supply voltage detection signal and outputting a signal having a phase contrary to the external supply voltage detection signal;
   a latch section for latching the signal received from the signal input section for a predetermined time period;
   a trigger section for generating a trigger signal for the latch section using the internal supply voltage detection signal and the delay signal of the internal supply voltage detection signal;
   a buffer section for buffering the output signal of the trigger section and outputting the buffered value to the latch section; and
   a signal output section for receiving an output signal of the latch section and the internal supply voltage detection signal and outputting a low level power-up signal at a falling edge of the internal supply voltage detection signal.

10. The circuit of claim 9, wherein the signal input section comprises:
   a NOR gate for NORing a signal inverted from the external supply voltage detection signal and the internal supply voltage detection signal; and
   an inverter for inverting an output signal of the NOR gate.

11. The circuit of claim 9, wherein the latch section comprises:
   a first NAND gate for NANDing an output signal of the signal input section and an output signal of the second NAND gate; and
   a second NAND gate for NANDing an output signal of the buffer section and an output signal of the first NAND gate.

12. The circuit of claim 9, wherein the trigger section comprises:
   an inverter for inverting the internal supply voltage detection signal;
   a signal delay section for delaying the output signal of the inverter for a predetermined time period; and
   a NAND gate for NANDing an output signal DEL of the signal delay section and the internal supply voltage detection signal.

13. The circuit of claim 9, wherein the buffer section comprises first and second inverters sequentially inverting the output signal of the trigger section.

14. The circuit of claim 9, wherein the signal output section comprises:
   a NOR gate for NORing an output signal of the latch section and the internal supply voltage detection signal; and
   an inverter for inverting the output signal of the NOR gate.

15. The circuit of claim 9, wherein said power-up signal is generated at a falling edge of said internal supply voltage detection signal.

16. A power-up circuit for a semiconductor memory device, the power-up circuit comprising:
   an external supply voltage level detector to detect an external supply voltage that is external to said memory device and to generate an external supply voltage detection signal that indicates when said external supply voltage has risen to a first predetermined level;
   an internal supply voltage level detector to detect an internal supply voltage that is internal to said memory device and to generate an internal supply voltage detection signal that indicates when said internal supply voltage has risen to a first predetermined level; and
   a power-up signal generator, responsive to said external and internal supply voltage detection signals, to generate a prevention signal that disables external access to said memory device until both said external and internal supply voltages have risen to said first and second predetermined voltage levels, respectively.

17. The circuit of claim 16, wherein said power-up signal is generated at a falling edge of said internal supply voltage detection signal.

* * * * *